(12) United States Patent
Komatsu et al.

(10) Patent No.: US 8,542,544 B2
(45) Date of Patent: Sep. 24, 2013

(54) SEMICONDUCTOR DEVICE HAVING A PLURALITY OF MEMORY REGIONS AND METHOD OF TESTING THE SAME

(75) Inventors: Katsuyoshi Komatsu, Tokyo (JP); Koji Mine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 387 days.

(21) Appl. No.: 12/926,889

(22) Filed: Dec. 15, 2010

(65) Prior Publication Data
US 2012/0026815 A1 Feb. 2, 2012

(30) Foreign Application Priority Data
Jul. 28, 2010 (JP) ................ P2010-169344

(51) Int. Cl.
*G11C 7/00* (2006.01)
(52) U.S. Cl.
USPC ............ 365/200; 365/185.09; 365/185.2
(58) Field of Classification Search
USPC ............ 365/200, 201, 185.09, 185.2
See application file for complete search history.

(56) References Cited

U.S. PATENT DOCUMENTS

| | | | |
|---|---|---|---|
| 5,544,106 A * | 8/1996 | Koike | ............ 365/200 |
| 5,652,725 A * | 7/1997 | Suma et al. | ............ 365/200 |
| 6,272,056 B1 | 8/2001 | Ooishi | |
| 7,061,799 B2 * | 6/2006 | Kawai et al. | ............ 365/185.09 |
| 7,719,906 B2 | 5/2010 | Tanimura et al. | |
| 8,072,827 B2 * | 12/2011 | Wakimoto | ............ 365/200 |

FOREIGN PATENT DOCUMENTS

| | | |
|---|---|---|
| JP | 10-172297 A | 6/1998 |
| JP | 2000-285694 A | 10/2000 |
| JP | 2005-346902 A | 12/2005 |
| JP | 2007-96918 A | 4/2007 |
| JP | 2009-26403 A | 2/2009 |

* cited by examiner

*Primary Examiner* — Pho M Luu
*Assistant Examiner* — Thao Bui
(74) *Attorney, Agent, or Firm* — McGinn IP Law Group, PLLC (57) ABSTRACT

A semiconductor device may include, but is not limited to, first and second memory regions, and first to fifth control circuits. The first and second memory regions are mutually exclusive at the same time. The first control circuit performs a first access to the first memory region. The second control circuit performs a second access to the second memory region. The third control circuit controls activation and deactivation of the first and second control circuits based on a first logic received from a plurality of first external terminals. The fourth control circuit switches between the first and second accesses based on at least a second logic received from a second external terminal. The fifth control circuit controls validation and invalidation of the fourth control circuit.

17 Claims, 7 Drawing Sheets

SEMICONDUCTOR DEVICE HAVING A PLURALITY OF MEMORY REGIONS AND METHOD OF TESTING THE SAME

BACKGROUND OF THE INVENTION

1. Field of the Invention

The present invention relates to a semiconductor device that replaces a defective memory cell with a redundant memory cell, and a method of testing the semiconductor device.

Priority is claimed on Japanese Patent Application No. 2010-169344, filed Jul. 28, 2010, the content of which is incorporated herein by reference.

2. Description of the Related Art

As the number of memory cells included in a semiconductor device increases, the possibility that defective memory cells will be formed increases in a manufacturing process. For this reason, when a defective memory cell is detected, the defective memory cell is replaced with a redundant memory cell to increase the yield of semiconductor devices. This technique is called "redundancy." In a general replacing method, a row or column of a defective memory cell is replaced with a row or column of a redundant memory cell in units of rows or columns of memory cells.

When semiconductor devices are shipped, it is necessary to previously confirm whether or not a defective memory cell is properly replaced with a redundant memory cell. For example, Japanese Patent Laid-Open Publication No. H10-172297 and No. 2005-346902 disclose a semiconductor device that tests a replaced row or column of a redundant memory cell in a test operation mode. This technique is called a "redundancy test."

There are a redundant memory row test and a redundant memory column test. Here, a redundant memory column test is explained. It is assumed in the redundant memory column test that a semiconductor testing device (hereinafter, "tester") supplies a power voltage or a signal to a semiconductor device.

The inventors of the present invention found that when a redundant memory column test is performed, semiconductor devices of related art have the following problems. Hereinafter, the problems of the semiconductor devices of the related art are explained with reference to FIGS. 6 and 7.

Figure 6:
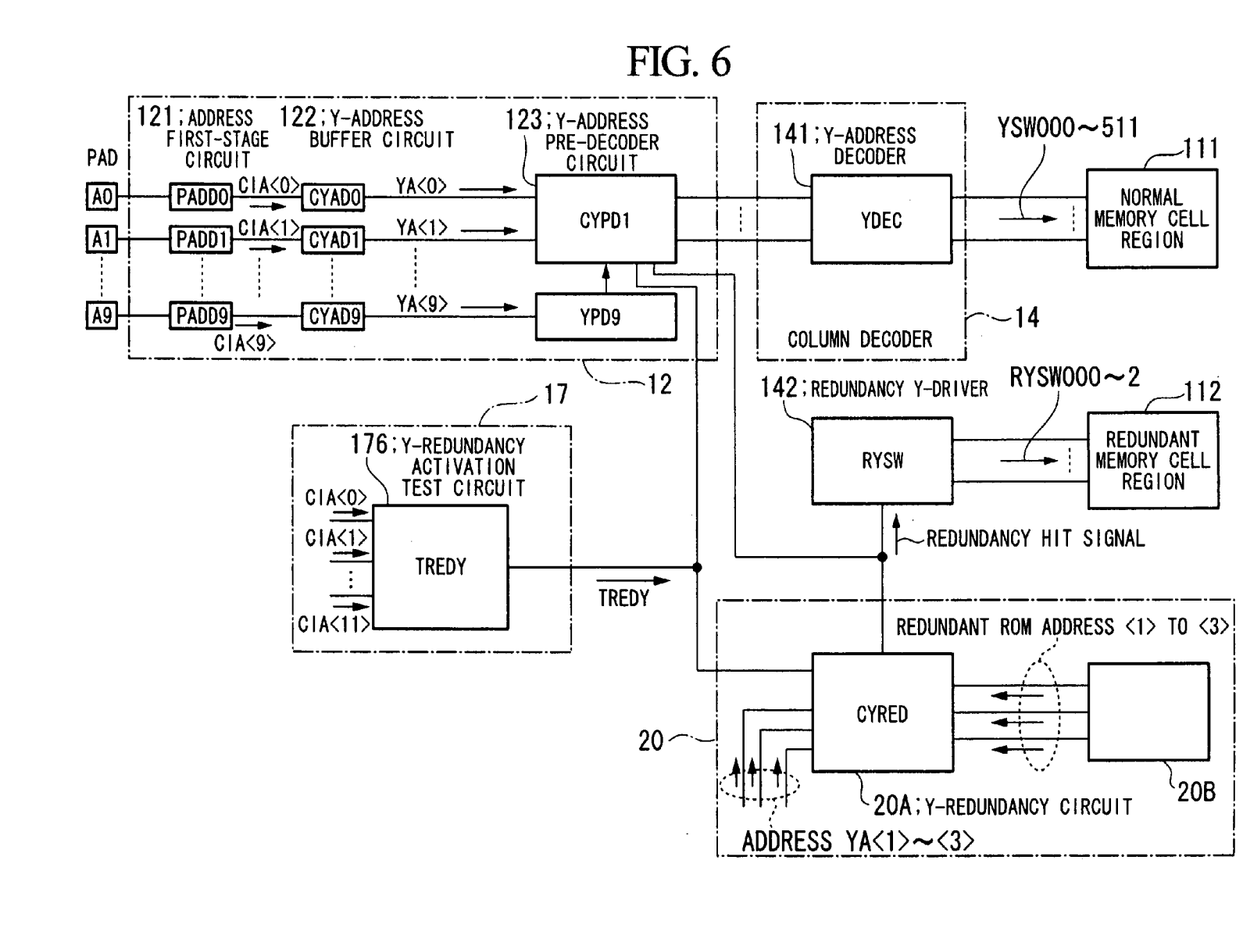
FIG. 6 is a block diagram illustrating a test circuit of a semiconductor device of a related art.

FIG. 6 is a block diagram illustrating a semiconductor device of the related art that performs a redundancy memory column test. The semiconductor device of the related art includes a normal memory cell region 111 and a redundant memory cell region 112. The normal memory cell region 111 and the redundant memory cell region 112 are memory regions including multiple memory cells arranged in a matrix defined by rows and columns. Multiple memory cells aligned in a row are selected by a word line. A bit line, which defines a column, is selected by a Y-switch signal. A memory cell positioned at the intersection of the word line with the bit line is connected to a local I/O line via the bit line. Thus, a memory cell is selected by a row and a column. Then, data stored in the memory cell is read out to the local I/O line in a reading operation of the semiconductor device of the related art. The data read out to the I/O line is read out to an external unit via an input/output circuit (not shown). In a wiring operation of the semiconductor device, data inputted via the input/output unit is written via the local I/O line and the bit line.

To select a row and a column, the semiconductor device of the related art includes a command decoder (not shown). The command decoder receives, from an external unit, any one of: an ACT command that orders activation of a word line; a READ command that orders a reading; a WRT command that orders a writing; a PRE command that orders deactivation of the semiconductor device; and an MRS command that orders setting of an operation mode. The command decoder decodes the received command, operates a control circuit based on the decoded command, and performs activation/deactivation of an internal circuit of the semiconductor device.

Upon power-on, the semiconductor device enters a pre-charge state in which a voltage at a predetermined connecting point of circuits (node) in a chip is charged up to a predetermined voltage. After the pre-charge ends, the semiconductor device automatically enters an idle state in which various commands are acceptable. When the semiconductor device receives, in the idle state, the MRS (mode resistor setting) command that orders the command decoder to set an operation mode, the command decoder sets to an internal mode resistor, based on a logic that is indicated by an address terminal and received with the MRS command, an operation mode of the semiconductor device, such as a test operation mode or a normal operation mode. The MRS command is simply called a mode resistor command.

While the normal operation mode is set to the mode resistor, a row address signal and the ACT command are inputted to an address buffer from an external tester. Then, the control circuit controls the address buffer to latch the row address signal, activates the row decoder, and thus selects memory cells aligned in a row indicated by the row address signal (which is hereinafter called selection control).

After the ACT command is supplied, the tester supplies, to the semiconductor device, the READ command or the WRT command together with a column address signal. A Y-address pre-decoder circuit 123, a column decoder 14, a redundancy Y-driver 142, and a Y-redundancy circuit 20A, which are shown in FIG. 6, are activated by the control circuit. The activated address buffer 12 buffers column address signals received from address terminals A0 (PAD A0) to A8 (PAD A8), and outputs the address signals YA<0> to YA<8> to the Y-address pre-decoder circuit 123.

The Y-address pre-decoder circuit 123 pre-decodes the address signals YA<0> to YA<8>, and outputs the resultant signals to the Y-address decoder 141. Based on the pre-decoded signals, the Y-address decoder 141 changes the level of any one of the Y-switch signals YSW000 to YSW511 to a high level, and turns on a Y switch corresponding to the high-level Y switch signal. Thus, the Y switch connects a bit line to the local I/O line.

Thus, when the Y-address decoder 141 is activated and receives pre-decode signals from the Y-address pre-decoder 143, the Y-address decoder 141 performs column selection control that connects, to the local I/O line, any one of memory cells that are aligned in a selected row and included in the normal memory cell region 111.

An address comparison circuit 20 includes a Y-redundancy circuit (CYRED) 20A and a nonvolatile memory circuit 20B. The nonvolatile memory circuit 20B stores information indicating positions of defective memory cells included in the normal memory cell region 111 (which information is called a redundant ROM address).

The Y-redundancy circuit 20A compares, to the redundant ROM address, an address signal YA received with the READ command or the WRT command from an external unit. If the address signal YA matches the redundant ROM address, the Y-redundancy circuit 20A outputs a redundancy Hit signal to the Y-address pre-decoder circuit (CYPD1) 123 and the redundancy Y-driver (RYSW) 142.

Although the Y-address pre-decoder 123 is activated, the Y-address pre-decoder 123 does not output the pre-decoded signals to the Y-address decoder 141 even when the redundancy Hit signal is received. Accordingly, the Y-address decoder 141 does not perform the column selection control so as not to access the defective memory cells.

On the other hand, the redundancy Y-driver 142 receives the redundancy Hit signal, outputs a redundancy Y-switch signal RYSW corresponding to the redundant ROM address, and performs a redundancy column selection control so as to access the redundant memory cell. Thus, defective memory cells in the normal memory cell region 111 are not accessed, and the redundant memory cells in the redundant memory cell region 112 are accessed by address replacement.

When the PRE command (pre-charge command) is supplied to the semiconductor device after the READ command or the WRT command is supplied, the activated circuits (the row decoder, the address buffer 12, the column decoder 14, the redundancy Y-driver 142, and the Y-redundancy circuit 20A) are deactivated by the control circuit. The above operations of the circuits shown in FIG. 6 are performed in the normal operation mode.

The semiconductor device of the related art further includes a Y-redundancy activation test circuit 176 that tests in the test operation mode whether or not a replaced defective memory cell is defective. The Y-redundancy activation test circuit 176 is controlled in the test operation mode. When the MRS command is supplied to the semiconductor device and the test operation mode is set to the mode resistor, the semiconductor device enters the test operation mode in which a memory cell included in the redundant memory cell region 112 is accessed.

Specifically, when the Y-redundancy activation test circuit 176 receives an address signal (MRS code) having the same logic as that of the address signal set to the Y-redundancy activation test circuit 176, the Y-redundancy activation test circuit 176 is activated, and outputs a test signal TREDY that is high level. When the semiconductor device receives a row address signal together with the ACT command from an external unit while the test operation mode is set to the mode resistor, the semiconductor device performs a row selection control that selects memory cells aligned in a row specified by the row address signal in a similar manner as in the normal operation mode.

Different from in the normal operation mode, however, even when the READ command or WRT command is supplied with the column address signal after the ACT command is supplied, the activated Y-address pre-decoder circuit 123 does not output pre-decoded signals since the test signal TREDY is inputted to the activated Y-address pre-decoder circuit 123. The Y-address decoder 141 does not receive pre-decoded signals, and therefore does not perform the column selection control in the normal memory cell region 111.

On the other hand, since the test signal TREDY is inputted to the semiconductor device, the Y-redundancy circuit 20A compares the address signal YA received from an external unit to the redundant ROM address. If the address signal YA matches the redundant ROM address, the Y-redundancy circuit 20A outputs a redundancy Hit signal to the redundancy Y-driver 142.

When the redundancy Y-driver 142 receives the redundancy Hit signal, the redundancy Y-driver 142 outputs a redundancy Y-switch signal RYSW corresponding to the redundant ROM address, and then performs a redundant-column selection control to access a redundant memory cell.

Thus, in the test operation mode, the semiconductor device of the related art cannot access memory cells included in the normal memory cell region 111, but can access memory cells included in the redundant memory cell region 112.

Since the semiconductor device of the related art has the above configuration, in the case of the circuit shown in FIG. 6, memory cells in the normal memory cell region 111 and memory cells in the redundant memory cell region 112, which are aligned in the same word line, cannot be sequentially tested while a word line is selected by supplying one ACT command. The reasons are explained hereinafter.

Figure 7:
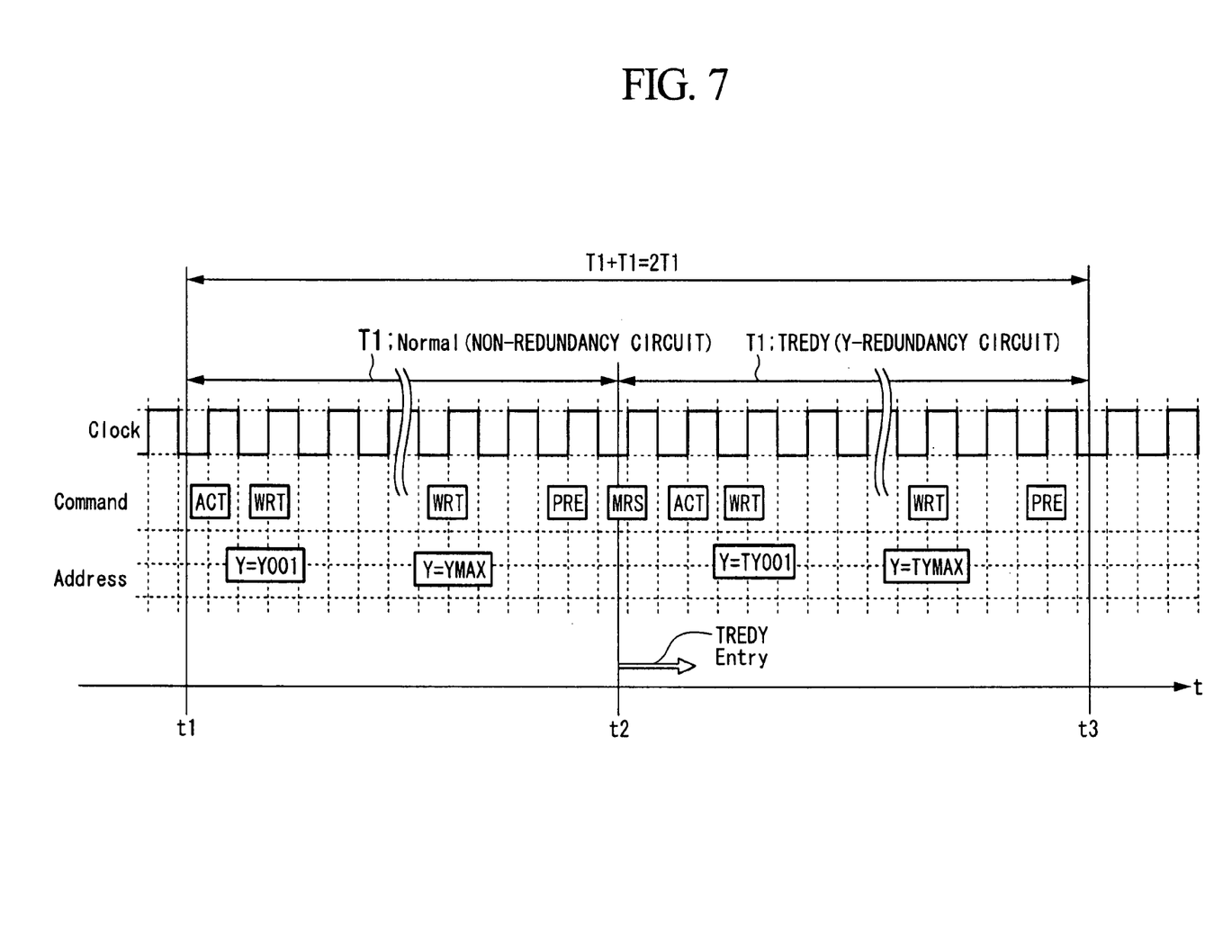
FIG. 7 is a timing chart illustrating an operation of the semiconductor device of the related art.

FIG. 7 is a timing chart illustrating an operation of the semiconductor device of the related art in the test operation mode. At the time t1, the semiconductor device decodes the ACT command supplied in synchronization with an external clock. Then, based on a row address supplied with the ACT command, the semiconductor device selects one word line in the normal memory cell region 111 and the redundant memory cell region 112.

After the ACT command is supplied, the semiconductor device decodes the WRT command supplied in synchronization with the external clock. Based on a column address supplied with the WRT command, the semiconductor device selects a first column region (position of which is indicated by Y=Y001) included in the normal memory cell region 111. Data supplied from an external unit is written in an accessed memory cell.

By the time t2, the semiconductor device decodes multiple WRT commands. Based on column addresses supplied with the respective WRT commands, the semiconductor device selects memory columns up to the last memory column (position of which is indicated by Y=YMAX) included in the normal memory cell region 111. Data supplied from an external unit is written in an accessed memory cell on each of the selected columns. When the semiconductor device receives the PRE command after receiving the final WRT command, the activated circuits of the semiconductor device are deactivated. Then, the semiconductor device enters the IDLE state.

Thus, since the semiconductor device is in the normal operation mode from the time t1 to the time t2, memory cells included in the normal memory cell region 111 are accessible, but memory cells included in the redundant memory cell region 112 are inaccessible.

At the time t2, the semiconductor device enters the test operation mode from the normal operation mode, and accesses memory cells included in the redundant memory cell region 112. To access memory cells included in the redundant memory cell region 112, it is necessary for the semiconductor device to enter the test operation mode. For this reason, the semiconductor device enters the test operation mode at the time t2 based on the supplied MRS command and a combination of logics of the address terminals A0 to A9 which are inputted to the mode resistor. Thus, the Y-redundancy activation test circuit 176 is activated, and outputs a test signal TREDY that is high-level.

The semiconductor device decodes an ACT command supplied after the MRS command from the tester in synchronization with the external clock. Based on a row address supplied with the ACT command, the semiconductor device selects one word line in the normal memory cell region 111 and the redundant memory cell region 112.

The semiconductor device decodes a WRT command supplied after the ACT command from the tester in synchronization with the external clock. Based on a column address supplied with the WRT command, the semiconductor device selects a first column region (position of which is indicated by Y=TY001) in the redundant memory cell region 112. Data supplied from an external unit is written in an accessed memory cell.

By the time t3, the semiconductor device decodes multiple WRT commands. Based on column addresses supplied with the respective WRT commands, the semiconductor device selects memory columns up to the last memory column (position of which is indicated by Y=TYMAX) included in the redundant memory cell region 112. Data supplied from the tester is written in an accessed memory cell in each of the selected columns. When the PRE command is received from the tester after the final WRT command, the activated circuits of the semiconductor device are deactivated. Then, the semiconductor device enters the IDLE state.

Thus, since the semiconductor device is in the test operation mode from the time t2 to the time t3, memory cells included in the redundant memory cell region 112 are accessible, but memory cells included in the normal memory cell region 111 are inaccessible.

The ACT command, the WRT command (or READ command), the PRE command, and the MRS command, which are supplied from the tester in the above test, are commands belonging to the same hierarchy (first hierarchy). The commands belonging to the same hierarchy are commands whose orders cannot be simultaneously performed by the semiconductor device. This is because the commands are supplied from the common external terminals.

Specifically, even if the mobile station device receives the MRS command while maintaining the state of the circuits activated by a supply of the ACT command, the mobile station device cannot perform the test mode operation specified by the MRS command. To perform the test mode operation, the tester has to supply, before supplying the MRS command, the PRE command to the semiconductor device so that the semiconductor device enters the idle mode.

For this reason, as explained above, a command that selects the redundant memory cell region 112 (MRS command) has to be inputted in order to sequentially access the two exclusive regions (the normal memory cell region 111 and the redundant memory cell region 112). In other words, one ACT command is inputted to activate an internal circuit. After the ACT command, the WRT command or READ command is supplied to access memory cells included in the normal memory cell region 111. Then, the PRE command is supplied to cause the semiconductor device to enter the IDLE state. To access a redundant memory cell, the MRS command is inputted to cause the semiconductor device to enter the test operation mode. In the test operation mode, the ACT command is inputted after the MRS command to activate respective internal circuits. Then, the WRT command or READ command is supplied after the ACT command to access memory cells included in the redundant memory cell region 112, in a similar manner as in the normal operation mode.

Thus, the semiconductor device of the related art sequentially tests memory cells included in the normal memory cell region 111 and memory cells included in the redundant memory cell region 112, which cannot be accessed simultaneously. For this reason, at each time of switching these regions, the tester has had to supply the ACT command, the PRE command, and the MRS command to the semiconductor device of the related art.

In other words, when an evaluation test of redundant memory cells is performed, the semiconductor device of the related art cannot access both the normal memory cell region 111 and the redundant memory cell region 112 during an operation cycle specified by one ACT command (while one word line is selected). Therefore, the semiconductor device of the related art has had to access these regions separately, thereby requiring a long testing time, and therefore causing an increase in testing cost.

Japanese Patent Laid-Open Publication No. H10-172297 discloses a semiconductor device that recognizes an address signal AX, which is received from an external unit based on a test mode signal TE, as an upper address indicating a redundant memory cell region. However, this is just technique of switching between the operation for the redundant memory cell region and the operation for the normal memory cell region by adding the upper bit AX. The adding of the upper bit AX to the address decoder, which is also used in the normal operation mode for an upper bit AX test, causes an increase in the number of gate inputs of the decoder and an increase in the number of gate stages, and thereby causes an access delay in the normal operation mode.

Japanese Patent Laid-Open Publication No. 2005-346902 only discloses a semiconductor device that uses a different operation timing for a control circuit to access a memory cell between an access to a normal memory cell and an access to a redundant memory cell when a redundant address signal corresponding to a redundant memory cell is received from a mode resistor to which a redundant address detection mode is set.

SUMMARY

In one embodiment, a semiconductor device may include, but is not limited to, first and second memory regions, and first to fifth control circuits. The first and second memory regions are mutually exclusive at the same time. The first control circuit performs a first access to the first memory, region. The second control circuit performs a second access to the second memory region. The third control circuit controls activation and deactivation of the first and second control circuits based on a first logic received from a plurality of first external terminals. The fourth control circuit switches between the first and second accesses based on at least a second logic received from a second external terminal. The fifth control circuit controls validation and invalidation of the fourth control circuit.

In another embodiment, a method of testing a semiconductor device may include, but is not limited to the following processes. A first logic is supplied to a mode register one time. A first command is supplied to a command control circuit one time. The first command orders activation of a word line. A second command and address information are supplied to the command control circuit multiple times. The second command orders selection of a bit line based on the address information. A second logic is supplied to a test circuit simultaneously with the second command. The second logic orders selection of any one of the bit line and a redundant bit line correlated to the bit line. Data access corresponding to the bit line and the redundant bit line is performed based on the first and second logics without supplying a third command that orders deactivation of the word line.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
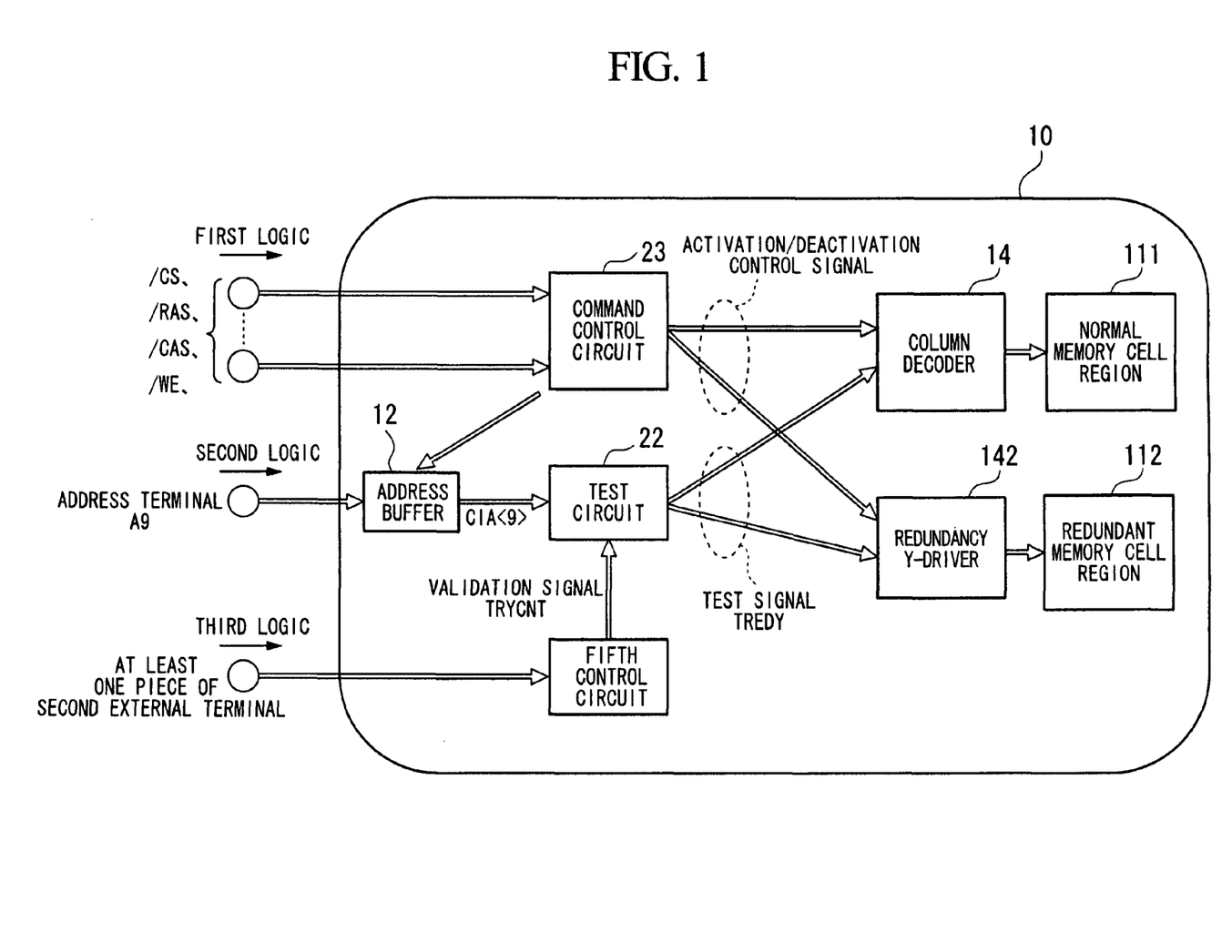
FIG. 1 illustrates a semiconductor device 10 according to a first embodiment of the present invention.

FIG. 1 illustrates a semiconductor device 10 according to a first embodiment of the present invention. The semiconductor device 10 includes: a normal memory cell region (normal region) 111; a redundant memory cell region (redundant region) 112; an address buffer 12; a column decoder 14; a redundancy Y-driver 142; a command control circuit 23; and a fifth control circuit.

In the normal memory cell region 111 and the redundant memory cell region 112, multiple memory cells are arranged in a matrix defined by rows and columns. The redundant memory cell region 112 includes redundant column memories to be replaced with column memories including defective memory cells when defective memory cells are included in the normal memory cell region 111.

The column decoder (first control circuit) 14 is a circuit that selects a memory column in the normal memory cell region 111. The redundancy Y-driver (second circuit) 142 is a circuit that selects a redundant column memory in the redundant memory cell region 112. Regarding memory cells included in the normal memory cell region 111 and memory cells included in the redundant memory cell region 112, memory cells aligned in a row is selected by a row decoder (not shown), and then a column is selected. Thus, a memory cell, which is positioned at an intersection of the row with the column, is accessed.

The command control circuit (third control circuit) 23 activates or deactivates the column decoder 14 and the redundancy Y-driver 142 based on an activation/deactivation control signal generated in the command control circuit 23. To generate the activation/deactivation control signal, the command control circuit 23 decodes a command indicated by logics of the external terminals (first logic indicated by the external terminals), i.e., a combination of logics of a chip select signal CS, a row-address strobe signal RAS, a column-address strobe signal CAS, and a write enable signal WE indicating a data writing operation, which are supplied from an external unit.

When the decoded command is an ACT command that activates the semiconductor device 10, the command control circuit 23 generates an activation/deactivation control signal indicating activation. When the decoded command is a READ command or a WRT command that causes data access to the normal memory cell region 111 and the redundant memory cell region 112, the command control circuit 23 activates the column decoder 14 and the redundancy Y-driver 142. When the decoded command is a PRE command that deactivates the semiconductor device 10, the command control circuit 23 generates an activation/deactivation control signal indicating deactivation in order to deactivate the column decoder 14 and the redundancy Y-decoder 142.

Based on, for example, a low/high-level signal (second logic indicated by the first external terminal) supplied to an address terminal (first external terminal) A9, the test circuit (fourth control circuit) 22 outputs a test signal TREDY to switch between the column decoder 14 and the redundancy Y-driver 142, which have been already activated by the READ or WRT command. At this time, the address buffer 12, which receives an address from the address terminal A9, has been activated by the command control circuit 23. The address buffer 12 outputs an address signal CIA<9> to the test circuit 22.

The fifth control circuit validates or invalidates the test circuit (fourth control circuit) 22 based on a low/high-level signal supplied to at least one second external terminal (third logic indicated by the second external terminal). The second external terminal may be a test-dedicated terminal provided in the semiconductor device 10. Alternatively, the second external terminal may be multiple external terminals similar to the command control circuit 23. In any cases, the fifth control circuit outputs a test circuit validation signal TRYCNT based on the low/high-level signal supplied to the second external terminal, and controls validation of the test circuit 22.

When both the command control circuit 23 and the fifth control circuit use the same second external terminal, i.e., when the second external terminal is the above external terminals, a command to be supplied to the second external terminal is a command other than the ACT command and the PRE command, which is, for example, an MRS command that specifies an operation mode of the semiconductor device 10. In this case, the fifth control circuit outputs to the test circuit 22, as the test circuit validation signal TRYCNT, the MRS code that is an output of the mode resistor to which the operation mode is set. The MRS command is simply called a mode resistor command.

By the above structure, when the semiconductor device 10 performs data access, the tester supplies the third logic (such as the MRS code) to the fifth control circuit to validate the test circuit (fourth control circuit) 22 before supplying the ACT command, and the READ or WRT command to activate the column decoder 14 and the redundancy Y-driver 142.

Then, the ACT command is supplied to select a word line in the normal memory cell region 111 and the redundant memory cell region 112. After the ACT command is supplied, the tester supplies the READ or WRT command together with a column address to an address terminal (not shown). Further, the tester supplies a low/high-level signal from the address terminal A9 to the test circuit 22. Thus, the tester performs a real-time control of switching between the column decoder 14 and the redundancy Y-driver 142. Accordingly, column selection is performed alternately or sequentially on the normal memory cell region 111 and the redundant memory cell region 112. Thus, memory cells in both the regions 111 and 112 can be accessed. In other words, the fifth control circuit and the test circuit (fourth control circuit) 22 enables a real-time access to memory cells in both the regions 111 and 112 without causing the semiconductor device 10 to be deactivated. Hereinafter, the first embodiment of the present invention is explained in detail with reference to the accompanying drawings.

Figure 2:
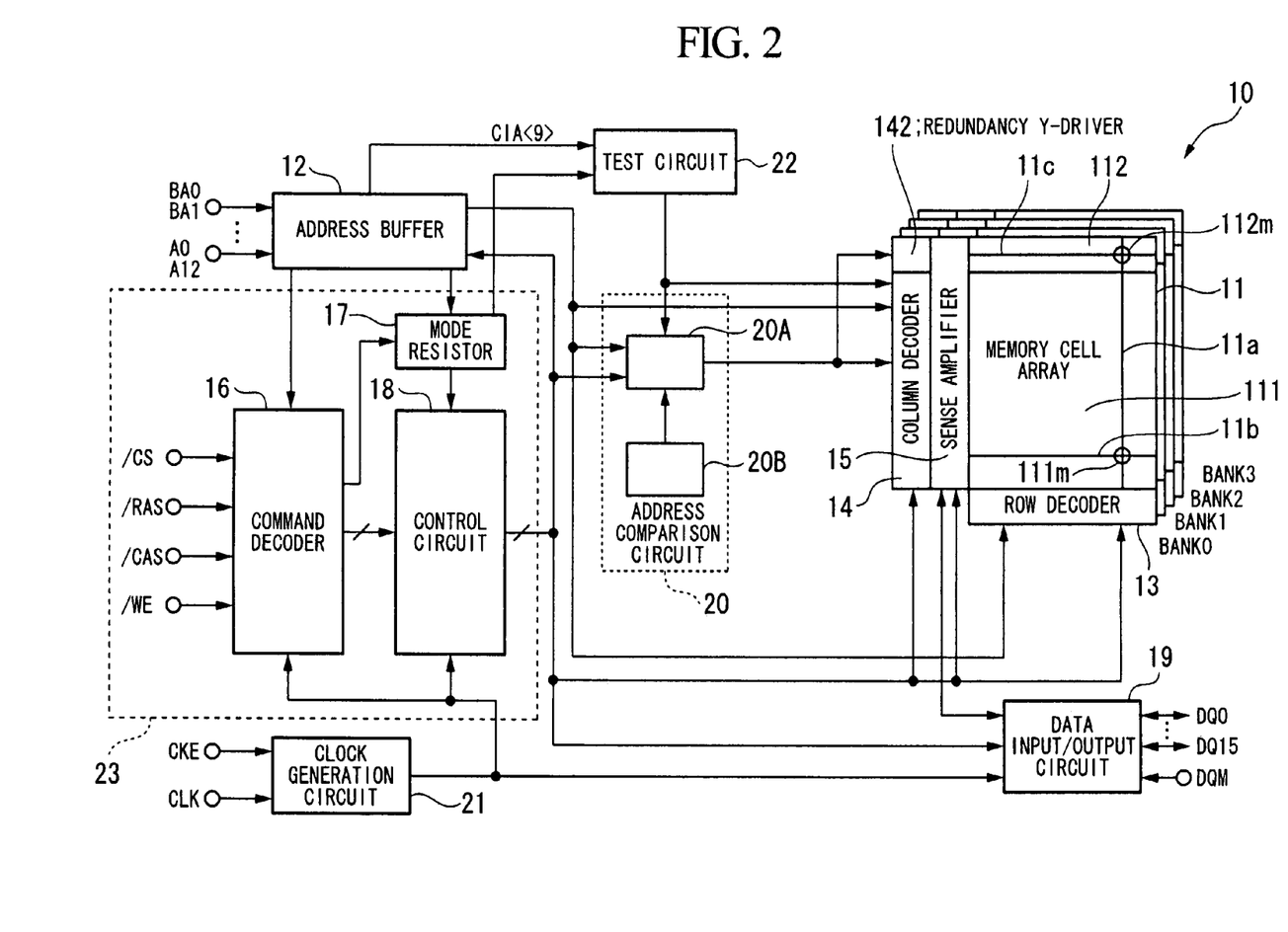
FIG. 2 is a block diagram illustrating circuits included in the semiconductor device 10.

FIG. 2 is a block diagram illustrating the semiconductor device 10 when the present invention is applied to an SDRAM (Synchronous Dynamic Random Access Memory) that operates in synchronization with a clock. Every circuit block shown in FIG. 2 is formed on a semiconductor chip made of a mono-crystalline silicon or the like. Each circuit block includes multiple transistors, such as a PMOS transistor (p-type MOS transistor) and an NMOS transistor (n-type MOS transistor). A circle denotes a pad as an external terminal provided in the semiconductor chip. In addition to the external terminals shown, a power voltage terminal, to which a power voltage is supplied from an external unit, is provided.

The semiconductor device 10 includes: a memory cell array 11; an address buffer 12; a row decoder 13; a column decoder 14; a sense amplifier 15; a command decoder 16; a mode resistor 17; a control circuit 18; a data input/output circuit 19; an address comparison circuit 20; a clock generation circuit 21; and a test circuit 22.

The memory cell array 11 includes four banks (BANK0 to BANK4). In each bank, multiple memory cells are arranged in a matrix defined by rows and columns. Each bank has the normal memory cell region 111 and the redundant memory cell region 112.

For example, a memory cell 111m in the normal memory cell region 111 is positioned at the intersection of a word line 11a with a bit line 11b. A memory cell 112m in the redundant memory cell region 112 is positioned at the intersection of a word line 11a with a bit line 11c.

The clock generation circuit 21 generates an internal clock signal that orders internal circuits (the command decoder 16, the control circuit 18, and the data input/output circuit 19) to operate based on a clock signal CLK and a clock enable signal CKE. The clock signal CLK is supplied from an external unit and has a predetermined frequency. The click enable signal CKE indicates that a clock is valid.

A control signal, which is supplied from an external unit to the semiconductor device 10, includes the clock signal CLK, the clock enable signal CKE, and the following control signals: a chip select signal /CS that orders the chip to enter a selection state (hereinafter, "an external memory control signal CS"); a row-address strobe signal /RAS (hereinafter, "an external memory control signal RAS"); a column-address strobe signal /CAS (hereinafter, "an external memory control signal CAS"); and a write enable signal /WE that orders wiring of data (hereinafter, "an external memory control signal WE"). A signal assigned "/" before the reference symbol indicates that a low level (L-level) is a valid level.

The command decoder 16 decodes the CS signal, the RAS signal, the CAS signal, and the WE signal, which are the external memory control signals, and part of an address signal, and thereby decodes a command supplied from an external unit (first logic indicated by the external terminals). Commands supplied to the semiconductor device 10 include: an ACT command that orders activation of the internal circuits of the semiconductor device 10; a READ command that orders reading; a WRT command that orders wiring; an MRS command that orders the mode resistor 17 to set an operation mode; and a PRE command that orders deactivation of the internal circuits activated by the ACT command.

The command decoder 16 retrieves, as command signals, the CS signal, the RAS signal, the CAS signal, and the WE signal, which are external memory control signals, and then decodes these signals. The command decoder 16 outputs an internal command signal corresponding to the decoded command to the control circuit 18. For example, the command decoder 16 outputs, to the control circuit 18, an internal active signal, an internal write signal, an internal read signal, and an internal pre-charge signal, which correspond to the ACT command, the WRT command, the READ command, and the PRE command, respectively.

The mode resistor 17 holds an address signal based on a combination of inputted active levels of the CS signal, the RAS signal, the CAS signal, and the WE signal, which are external memory control signals, and performs initial setting of each operation mode, such as entry to the test operation mode.

In accordance with each operation mode set to the mode resistor and the internal command signal from the command decoder 16, the control circuit 18 generates a control signal that controls each circuit in the semiconductor device 10 (the address buffer 12, the row decoder 13, the column decoder 14, the sense amplifier 15, the Y-redundancy circuit 20A, and the data input/output circuit 19). For example, in accordance with a variation in logic levels of the internal active signal and the internal pre-charge signal, the control unit 18 performs timing control on an activation/deactivation control signal that controls the row decoder 13, the column decoder 14, the sense amplifier 15, the address comparison circuit 20, and the data input/output circuit 19 to be activated. Then, the control unit 18 outputs a resultant signal.

Additionally, in accordance with a variation in logic level of the internal write signal, the control circuit 18 performs timing control on the write control signal that activates the data input/output unit 19, and outputs a resultant signal.

The address buffer 12 retrieves, by a multiplex method, address data indicating the position of a memory cell (hereinafter, simply called "address"), which is received from an external unit, while the address buffer 12 is activated by the ACT command. The multiplex method is a method of retrieving, based on the ACT command, a row address indicating the position of a memory cell and of retrieving, based on the READ or WRT command, a column address indicating the position of a memory cell, in chronological order.

The row decoder 13 decodes, while being activated by the ACT command, the row address retrieved by the address buffer 12, and then select a corresponding word line in the memory cell array 11 (for example, the word line 11a). Multiple memory cells connected to the selected word line are connected to respective bit lines (such as the bit lines 11b and 11c in the case of the memory cells 111m and 112m, respectively). Data stored in each memory cell is read out to the bit line.

The sense amplifier 15 is activated by the ACT command, and amplifies a voltage which is read out to a bit line based on the internal read signal or the internal write signal. While the semiconductor device 10 performs a reading operation, the sense amplifier 15 outputs the amplified data to the data input/output circuit 19 via the column switch and the I/O line selected. While the semiconductor device 10 performs a writing operation, the sense amplifier 15 writes, in a memory cell, data received from the data input/output circuit 19 via the column switch and the I/O line.

While being activated by the WRT command (or READ command) following the ACT command, the column decoder 14 decodes a column address retrieved by the address buffer 12, and then selects a corresponding column (bit line) in the normal memory cell region 111.

When the column address retrieved by the address buffer 12 is an address indicating the position of a defective memory cell, the redundancy Y-driver 142 selects a corresponding bit line in the redundant memory cell region 112 instead of the bit line in the normal memory cell region 111. Accordingly, the bit line selected from the normal memory cell region 111 or the redundancy memory cell region 112 is connected to the I/O line.

The address comparison circuit 20 determines whether or not the column address retrieved by the address buffer 12 is an address indicating the position of a defective memory cell. The address comparison circuit 20 includes a Y-redundancy circuit (CYRED) 20A and a nonvolatile memory circuit 20B. The nonvolatile memory circuit 20B includes a laser fuse element or an electric fuse. The nonvolatile memory circuit 20B stores a redundant ROM address indicating the position of a defective memory cell in the normal memory cell region 111. The Y-redundancy circuit 20A compares, to the redundant ROM address, the address signal inputted to the semiconductor device 10 from an external unit. If the address signal matches the redundant ROM address, the Y-redundancy circuit 20A outputs a redundant Hit signal. If the redundancy Hit signal is received, the column decoder 14 is prohibited from performing the column selection. Meanwhile, the redundancy Y-driver 142 selects a redundant column.

While the semiconductor device performs a reading operation, the data input/output circuit 19 outputs the data, which is read out from the memory cell array 11 via the I/O line, to an external unit via data input/output terminals DQ0 to DQ15. In a writing operation, the data input/output circuit 19 latches data received via the data input/output terminals DQ0 to DQ15, and supplies the data to the sense amplifier 15 via the I/O line. Based on a control signal DQM supplied from an external unit, the data input/output circuit 19 determines whether or not to mask (validate), for example, 16-bit data DQ0 to DQ15.

The test circuit 22 is a characteristic part of the first embodiment of the present invention, and will be explained later. Here, an operation of the semiconductor device 10, when a command related to the first embodiment is supplied from an external unit, is briefly explained.

The ACT command is inputted to the command decoder 16 if the external memory control signals CA and RAS are low-level and the external memory control signals CAS and WE are high-level on the rising edge of the clock signal CLK supplied from an external unit. At this time, the level of an internal active signal among internal command signals of the command decoder 16 changes from the low-level to the high-level. In response to the change in level of the internal active signal to the high-level, an active operation is performed in the semiconductor device 10. In other words, the row decoder 13 and the address buffer 12 are activated by receiving an activation/deactivation signal indicating activation. At the same time of the input of the ACT command, the address buffer 12 latches an address signal received from an external unit. Then, the activated raw decoder 13 decodes the latched address signal, and selects and drives a word line in the memory cell array 11. Additionally, by the input of the ACT command, the sense amplifier 15 and the data input/output circuit 19 are activated by receiving an activation/deactivation signal indicating activation. The control circuit 18 performs timing adjustment on the activation/deactivation signal indicating activation, and then outputs a resultant signal to the sense amplifier 15. The sense amplifier 15 receiving the timing-adjusted signal amplifies a voltage of a bit line.

In a writing operation, the WRT command is inputted to the command decoder 16 if the external memory control signals CS, CAS, and WE are low-level and the external memory control signal RAS is high-level on the rising edge of the clock signal CLK. At this time, the level of an internal write signal among internal command signals of the command decoder 16 changes from the low-level to the high-level. In response to the change in level of the internal write signal to the high-level, a write operation is performed in the semiconductor device 10. In other words, the address buffer 12 already activated by the ACT command latches an address signal received from an external unit together with the WRT command. Based on the latched address signal, the column decoder 14 or the redundancy Y-driver 142, which is activated by the WRT command, selects a bit line in the memory cell array 11. The control circuit 18 performs timing control on a write control signal, and outputs the resultant signal to the data input/output circuit 19. The data input/output circuit 19 receiving a write control signal drives, together with the sense amplifier 15, the bit line in the memory cell array 11 selected via the I/O line and the column switch, and writes data received from an external unit in a memory cell.

In a reading operation, the READ command is inputted to the command decoder 16 if the external memory control signals CS and CAS are low-level and the external memory control signals RAS and WE are high-level on the rising edge of the clock signal CLK. At this time, the level of an internal read signal among internal command signals of the command decoder 16 changes from the low-level to the high-level. In response to the change in level of the internal read signal to the high-level, a read operation is performed in the semiconductor device 10. In other words, the address buffer 12 already activated by the ACT command latches an address signal received from an external unit together with the READ command. Based on the latched address signal, the column decoder 14 or the redundancy Y-driver 142, which is activated by the READ command, selects a bit line in the memory cell array 11. The control circuit 18 performs timing control on the read control signal, and outputs the resultant signal to the data input/output circuit 19. The data input/output circuit 19 receiving a read control signal receives, via the I/O line and the column switch, a voltage of the bit line in the memory cell array 11, which is amplified by the sense amplifier 15. Then, the data input/output circuit 19 reads out data stored in the memory cell to an external unit.

Upon entry to the IDLE state after the reading or writing operation, the PRE command is inputted to the command decoder 16 if the external memory control signals CS, RAS, and WE are low-level and the external memory control signal CAS is high-level on the rising edge of the clock signal CLK. At this time, the level of an internal pre-charge signal among internal command signals of the command decoder 16 changes from the low-level to the high-level. In response to the change in level of the internal pre-charge signal to the high-level, a pre-charge operation is performed in the semiconductor device 10. In other words, the row decoder 13 is deactivated by receiving an activation/deactivation signal indicating deactivation. A word line of the memory cell array 11 enters the non-selected state. A bit line of the memory cell array 11 is pre-charged to a predetermined voltage. Thus, the semiconductor device 10 enters the IDLE state. By the input of the PRE command, the column decoder 14, the sense amplifier 15, the Y-redundancy circuit 20A, and the data input/output circuit 19 are deactivated by receiving an activation/deactivation signal indicating deactivation.

To enter the test operation mode, the MRS command is inputted to the command decoder 16 if all the external memory control signals CS, RAS, WE, and CAS are low-level on the rising edge of the clock signal CLK. The MRS command is inputted to the mode resistor 17. If a logic of the inputted address is a predetermined logic, the mode resistor 17 generates an MRS code indicating that the semiconductor device 10 is to enter the test operation mode. The MRS code is latched by the mode resistor 17, and used for validation control of the test circuit 22.

When the ACT command, the READ command, and the like are supplied to the semiconductor device 10 that has received the MRS command and has entered the test operation mode, the semiconductor device 10 performs operation specified by the supplied command.

The mode resistor 17 holds the MRS code until another MRS code is supplied. When the semiconductor device 10 enters the normal operation mode from the test operation mode, the semiconductor device 10 releases the MRS code held by the mode resistor 17 based on logics of another supplied MRS command and an inputted address, and sets the normal operation mode.

Figure 3:
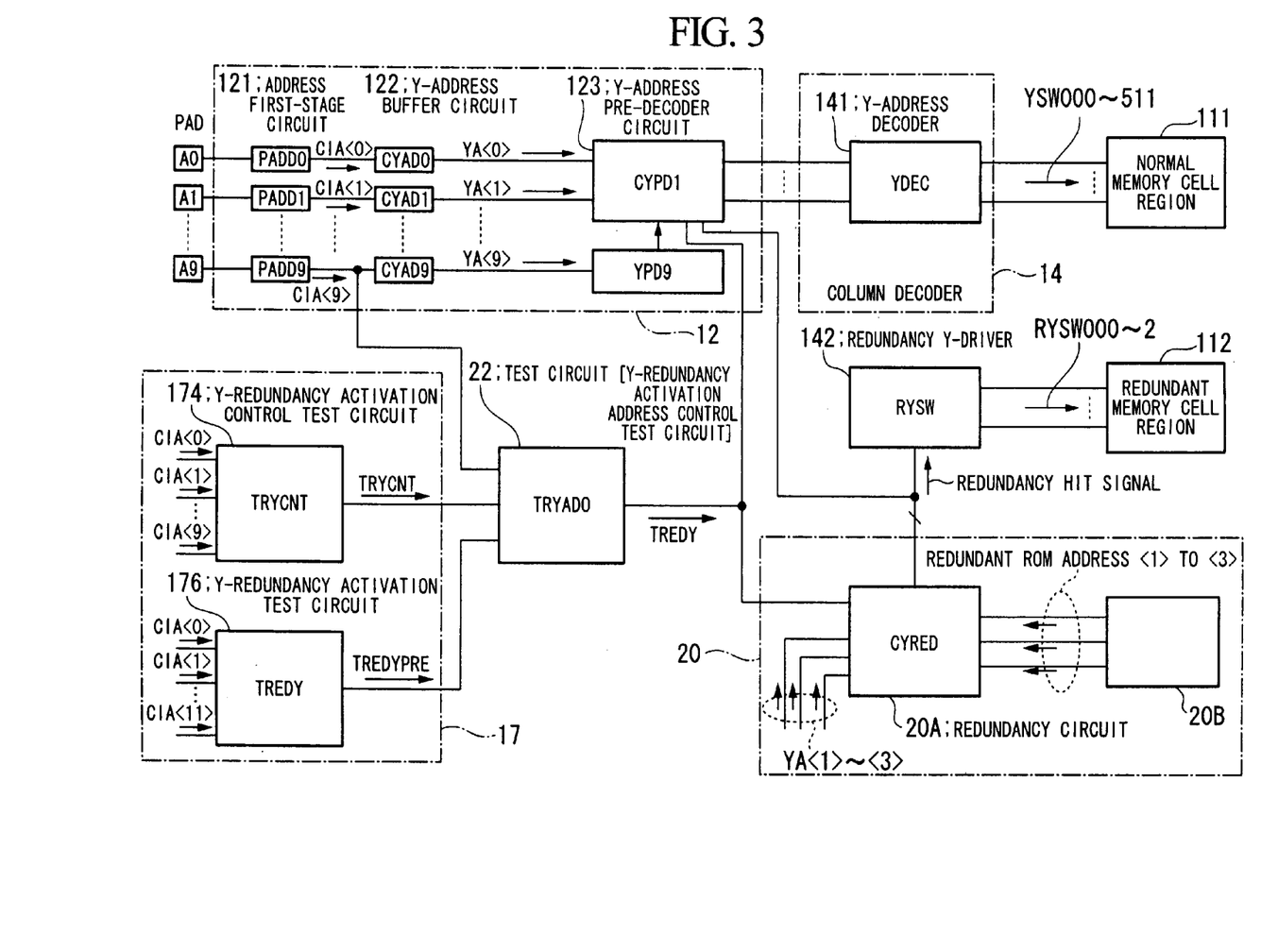
FIG. 3 is a block diagram illustrating a test circuit 22 shown in FIG. 2.

Hereinafter, the test circuit 22 is explained with reference to FIG. 3. FIG. 3 is a block diagram illustrating the test circuit 22 shown in FIG. 2. The address buffer 12 includes: address first-stage circuits (PADD0 to PADD9) 121 corresponding to the address terminals A0 to A9, respectively; Y-address buffer circuits (CYAD0 to CYAD9) 122; and the Y-address pre-decoder circuits (CYPD1 and YPD9) 123.

The address buffer 12 is used when the semiconductor device 10 retrieves a row address based on the ACT command and when the semiconductor device 10 retrieves a column address based on the READ command or the WRT command. For this reason, in the first embodiment, the Y-address buffer circuit (CYAD9) and the Y-address pre-decoder circuit (YPD9) corresponding to the address terminal A9 are not used for selecting a column address. In other words, a logic "0" or "1" indicated by the address terminal A9 is bit information that is not used for the Y-address decoder 141 to perform column address selection in which memory cells in the normal memory cell region 111 are selected in units of columns. However, the address first-stage circuit (PADD9) similarly retrieves an address (second logic) from the address terminal A9 when the other address first-stage circuits (PADD0 to PADD8) retrieve column addresses based on the READ or WRT command. In other words, the command control circuit (third control circuit) 23 activates the address first-stage circuit PADD9 when receiving the READ or WRT command so that an H/L level signal of the address terminal (first external terminal) A9 (i.e., second logic indicated by the first external terminal) is supplied to the test circuit 22.

The address first-stage circuit 121 (including the first-stage circuit corresponding to the address terminal A9) is activated by the command control circuit 23 based on the received MRS command. Then, the address first-stage circuit 121 outputs to the mode resistor 17, as an internal address signal CIA (MRS code), the H/L level signals (first logic), which are supplied to the respective terminals, without changing the logic level.

The Y-address decoder 141 corresponds to the column decoder 14 shown in FIG. 2. The Y-address decoder 141 decodes a pre-decoded signal outputted by the Y-address pre-decoder circuit 123, changes the level of any one of the Y-switch signal YSW000 to YSW511 to the high-level, and selects memory cells in the normal memory cell region 111 in units of columns.

The address comparison circuit 20 includes the Y-redundancy circuit (CYRED) 20A and the nonvolatile memory circuit 20B. The nonvolatile memory circuit 20B includes a laser fuse element or an electric fuse. The nonvolatile memory circuit 20B stores information indicating the position of a column including a defective memory cell in the normal memory cell region 111 (the information is called a redundant ROM address).

The Y-redundancy circuit 20A compares, to the redundant ROM address, the address signal YA, which is inputted to the semiconductor device 10 from an external unit together with the READ or WRT command. If the address signal YA matches the redundant ROM address, the Y-redundancy circuit 20A outputs a redundant Hit signal to the Y-address pre-decoder circuit (CYPD1) 123 and the redundancy Y-driver (RYSW) 142.

When an address corresponding to a redundant ROM address is inputted to the semiconductor device 10 from an external unit, the Y-address pre-decoder circuit 123 receives the redundancy Hit signal, and thereby does not output the pre-decoded signals to the Y-address decoder 141. Accordingly, the Y-address decoder 141 does not perform the column selection control. Therefore, a column, to which defective memory cells are connected, is not selected. On the other hand, the redundancy Y-driver 142 receives the redundancy Hit signal, outputs the redundancy Y-switch signal RYSW corresponding to a redundant ROM address, performs the redundant column selection control, and thereby accesses to redundant memory cells. Thus, defective memory cells in the normal memory cell region 111 are not accessed, but redundant memory cells in the redundant memory cell region 112 are accessed.

In other words, the column selection operation by the Y-address pre-decoder circuit 124 and the Y-address decoder (first control circuit) 141, and the column selection operation by the Y-redundancy circuit 20A and the redundancy Y-driver (second control circuit) 142 are not performed simultaneously. In other words, the above two column selection operations are exclusive operations.

The mode resistor 17 shown in FIG. 2 includes a Y-redundancy activation control test circuit (fifth control circuit) 174 and a Y-redundancy activation test circuit 176. The Y-redundancy activation control test circuit 174 receives the address signal CIA (MRS code) that is retrieved by the mode resistor 17 when the MRS command is supplied to the semiconductor device 10. If a logic of the MRS code matches a logic of a predetermined code, the Y-redundancy activation control test circuit 174 generates a test circuit validation signal TRYCNT that is high-level and indicates entry of the semiconductor device 10 to the test operation mode (first test mode). During the power is on until receipt of another MRS command and thereby receipt of another MRS code, the Y-redundancy activation control test circuit 174 outputs the test circuit validation signal TRYCNT that is high-level to the test circuit 22.

The Y-redundancy activation test circuit 176 is the circuit explained in the "description of the related art." Similarly, the Y-redundancy activation test circuit 176 receives an address signal CIA (MRS code) retrieved by the mode resistor 17 simultaneously with the MRS command. If a logic of the MRS code matches a logic of a previously-set code (which is different from the code for the Y-redundancy activation control test circuit 174), the Y-redundancy activation test circuit 176 generates a test signal TREDYPRE that is high-level and indicates entry of the semiconductor device 10 to the test operation mode (second test mode).

The test circuit (fourth control circuit; Y-redundancy activation control test circuit TRYD0) 22 receives an internal address signal CIA<9>, a test circuit validation signal TRYCNY, and a test signal TREDYPRE, and outputs a test signal TREDY.

In the first test mode, the test circuit 22 outputs a test signal TREDY that is high-level if the test circuit 22 receives a test circuit validation signal TRYCNT that is high-level and if a second internal address signal CIA<9>, which is a logic of the address terminal A9, is high-level. Additionally, the test circuit 22 outputs a test signal TREDY that is low-level if the test circuit 22 receives a test circuit validation signal TRYCNT that is high-level and if a second internal address signal CIA<9> is low-level.

In other words, the Y-redundancy activation control test circuit (fifth control circuit) 174 changes the level of the test circuit validation signal TRYCNT that validates an operation of the test circuit (fourth control circuit) 22 from the low-level to the high-level, based on a logic indicated by the at least second external terminal (or external terminals which are connected to the command control circuit 23 and which receive the external memory control signals CS, RAS, CAS, and WE), i.e., a logic indicating that the MRS command is to be supplied (third logic; all the external memory control signals are low-level).

In the second test mode, the test circuit 22 receives a test signal TREDYPRE that is high-level and outputs a test signal TREDY that is high-level.

When the test signal TREDY is high-level in the first test mode, the Y-address pre-decoder circuit 123 does not output pre-decoded signals corresponding to a column address retrieved simultaneously with the READ command or the WRT command. For this reason, the Y-address decoder 141 does not perform a column selection in the normal memory cell region 111. On the other hand, when the test signal TREDY is high-level, and when the column address retrieved simultaneously with the READ or WRT command matches a redundant ROM address, the Y-redundancy circuit 20A outputs the redundant Hit signal to the redundancy Y-driver 142. Accordingly, the redundancy Y-driver 142 outputs a redundancy Y-switch signal RYSW corresponding to the redundant ROM address, and performs a redundant column selection.

When the test signal TREDY is low-level in the first test mode, the Y-address pre-decoder circuit 123 outputs pre-decoded signals corresponding to a column address retrieved simultaneously with the READ command or the WRT command. Thereby, the Y-address decoder 141 outputs a column switch signal corresponding to the retrieved column address, and performs a column selection in the normal memory cell region 111. On the other hand, when the test signal TREDY is low-level, the Y-redundancy circuit 20A does not determine whether or not the column address, which are retrieved simultaneously with the READ or WRT command, matches a redundant ROM address. Therefore, the Y-redundancy circuit 20A does not output a redundancy Hit signal. For this reason, the redundancy Y-driver 142 does not output a redundancy Y-switch signal RYSW corresponding to the redundant ROM address, and does not perform a redundant column selection.

In other words, the test circuit (fourth control circuit) 22 changes the level of the test signal TREDY to a L/H level based on the L/H level signal inputted to the address terminal (first external terminal) A9 (i.e., the second logic indicated by the first external terminal). The test circuit 22 changes the level of the test signal TREDY to a L/H level, and switches between the column selection operation in the normal memory cell region 111 by the Y-address pre-decoder circuit 123 and the Y-address decoder (first control circuit) 141, and the column selection operation in the redundant memory cell region 112 by the Y-redundancy circuit 20A and the redundancy Y-driver (second control circuit) 142. These two column selection operations are not performed simultaneously, and are exclusive operations.

Such a configuration enables the semiconductor device 10 to access a memory cell in the normal memory cell region 111 and a memory cell in the redundant memory cell region 112 in the test operation mode (first test mode).

Figure 4:
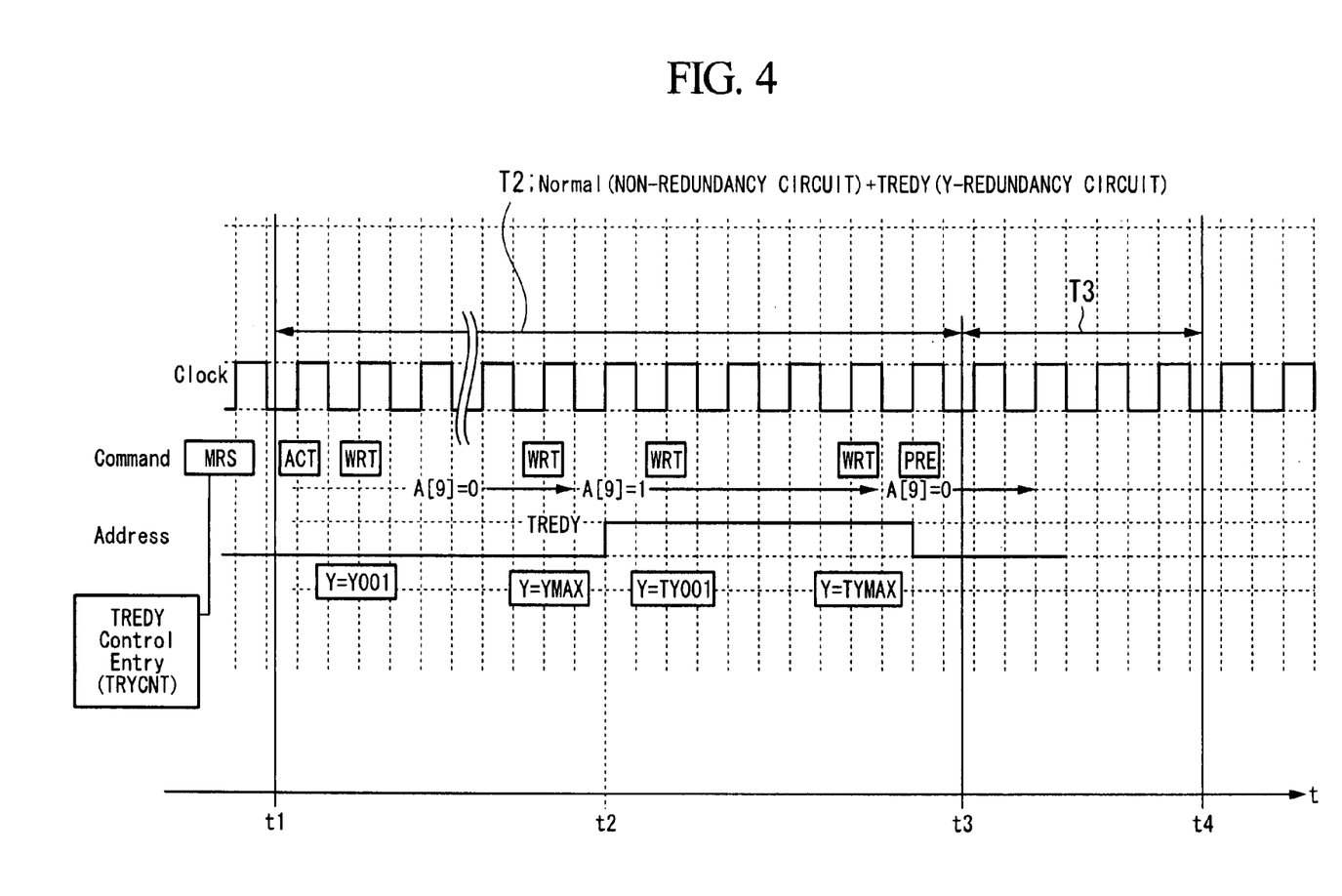
FIG. 4 is a timing chart illustrating an operation of the semiconductor device 10.

FIG. 4 is a timing chart illustrating an operation of the semiconductor device 10. On the rising edge of the clock signal CLK before the time t1, the command decoder 16 of the semiconductor device 10 receives an MRS command (external memory control signals CS, RAS, WE, and CAS which are low-level). The Y-redundancy activation control test circuit 174 of the mode resistor 17 receives an MRS command. Since a logic of the received address is a predetermined logic, the Y-redundancy activation control test circuit 174 changes the level of the test circuit validation signal TRYCNT from low-level to the high-level. Then, the Y-redundancy activation control test circuit 174 maintains the high-level of the test circuit validation signal TRYCNT until receipt of another MRS command.

On the next rising edge of the clock signal CLK after the time t1, the command decoder 16 of the semiconductor device 10 receives an ACT command (external memory control signals CS and RAS which are low-level, and external memory control signals CAS and WE which are high-level).

The row decoder 13 and the address buffer 12 receive, from the command control circuit 23, an activation/deactivation control signal indicating activation, and thus become activated. At the same time of the receipt of the ACT command, an address signal received from an external unit is latched by the address buffer 12. The activated row decoder 13 decodes the latched address signal, and selects and drives a word line of the memory cell array 11. By the input of the ACT command, the sense amplifier 15 and the data input/output circuit 19 receive an activation/deactivation control signal that indicates activation, and thus become activated.

The control circuit 18 performs timing adjustment on the activation/deactivation control signal indicating activation, and outputs the timing-adjusted signal to the sense amplifier 15. The sense amplifier 15 receiving the timing-adjusted signal amplifies a voltage of the bit line.

On the rising edge of the clock signal CLK after the input of the ACT command, the command decoder 16 of the semiconductor device 10 receives a WRT command (external memory control signals CS, CAS, and WE which are low-level, and an external memory control signal RAS which is high-level). At this time, the level of the internal write signal included in the internal command signal of the command decoder 16 changes from the low-level to the high-level. According to the change in level of the internal write signal to the high-level, a write operation is performed in the semiconductor device 10. In other words, the address buffer 12, which has been already activated by the ACT command, latches an address signal which is received from an external unit together with the WRT command. The Y-address pre-decoder circuit 123, the column decoder 14, the Y-redundancy circuit 20A, and the redundancy Y-driver 142 are activated by the WRT command.

Since a low-level signal is inputted to the address terminal A9, the address first-stage circuit outputs an internal address signal CIA<9> that is low-level to the test circuit 22. The test circuit 22 maintains the low-level of the test signal TREDY since the test circuit validation signal TRYCNT is already high-level by the MRS command.

The column decoder 14 decodes the latched address signal (Y=Y001), changes the level of the Y switch signal YSW000 to the high-level, and selects a bit line of the memory cell array 11. The control circuit 18 performs timing control on the write control signal, and outputs the resultant signal to the data input/output circuit 19. The data input/output circuit 19 receiving the write control signal, together with the sense amplifier 15, drives the selected bit line in the normal memory cell region 111 via the I/O line and the column switch. Then, the data input/output circuit 19 writes data received from an external unit in a memory cell.

From the first input of the WRT command to the time t2, the command decoder 16 decodes multiple WRT commands. According to each WRT command, the level of the internal write signal changes from the low-level to the high-level in the internal command signal of the command decoder 16. According to the change in level of the internal write signal to high-level, a write operation is performed in the semiconductor device 10. In other words, the address buffer 12, which has been already activated by the ACT command, latches an address signal received from an external unit together with the WRT command.

During that period, a low-level signal is inputted to the address terminal A9, and the internal address signal CIA<9> is low-level. Therefore, the test circuit 22 maintains the low-level of the test signal TREDY.

Every time the WRT command is inputted to the semiconductor device 10, the Y-address decoder 141 selects columns up to the last memory column (the position of which is specified by Y=YMAX) in the normal memory cell region 111 based on the column address supplied simultaneously with the supply of the WRT command. Data pieces supplied from an external terminal are written in accessed memory cells in each column selected.

When the level of the signal inputted to the address terminal A9 changes from the low-level to the high-level at the time t2, the test circuit 22 changes the level of the test signal TREDY from the low-level to the high-level. Thereby, the test circuit 22 changes the column selection operation in the normal memory cell region 111 by the Y-address pre-decoder circuit 123 and the Y-address decoder (first control circuit) 141 to the column selection operation in the redundant memory cell region 112 by the Y-redundancy circuit 20A and the redundancy Y-driver (second control circuit) 142.

From the time t2 to the time that a PRE command is inputted, multiple WRT commands are inputted to the semiconductor device 10. The command decoder 16 decodes each WRT command. According to each WRT command, the level of the internal write signal changes from the low-level to the high-level in the internal command signal of the command decoder 16. According to the change in level of the internal write signal to the high-level, a write operation is performed in the semiconductor device 10. In other words, the address buffer 12, which has been already activated by the ACT command, latches an address signal received from an external unit together with the WRT command.

During that period, a high-level signal is inputted to the address terminal A9, and the internal address signal CIA<9> is high-level. Therefore, the test circuit 22 maintains the high-level of the test signal TREDY.

Every time the WRT command is inputted to the semiconductor device 10, the Y-redundancy circuit 20A compares, to the redundant ROM address, the column address supplied simultaneously with the WRT command. If the column address matches the redundant ROM address, the Y-redundancy circuit 20A outputs a redundancy Hit signal. The redundancy Y-driver 142 receives the redundancy Hit signal, outputs a redundancy Y-switch signal RYSW corresponding to the redundant ROM address, and selects the last column of memory cells in the redundant memory cell region 112 (position of which is specified by Y=TYMAX) in units of columns. Data supplied from an external unit is written in an accessed memory cell in each selected column.

The WRT command is executed by a known burst write method. The burst write method is a method in which only data to be written is supplied from an external unit based on one WRT command and an address supplied with the WRT command in synchronization with a rising edge of the clock signal CLK, and is written in a corresponding memory cell without receiving the next WRT command and the next address in synchronization with the next clock signal CLK. The burst length is, for example, 8, 16, 64, and the like. The next address is generated by an internal address generation circuit (internal address counter) (not shown) from the address supplied with the WRT command.

Additionally, the same applies to a read check of multiple memory cells based on a READ command after expectation values are written in the memory cells based on a WRT command. The READ command is executed by a known bust read method.

Further, in the test mode, a second test circuit (not shown) may be provided which supplies a pseudo low address (zero address of a column) to the Y-redundancy circuit (CYRED) 20A, in lieu of the information that the nonvolatile memory circuit 20B supplies to the Y-redundancy low address (redundant ROM address). Only one time supply of a WRT command and a column address (Y=zero address) accompanying the WRT command after the time t2 enables easy and fast access to a redundant memory cell. If there are eight redundant columns, multiple pseudo low addresses of the zero address, and the first to seventh addresses may be supplied. If the burst write method with the burst length of 8 is used, only one WRT command may be supplied.

On the rising edge of the clock signal CLK following the last WRT command, the command decoder 16 of the semiconductor device 10 receives PRE commands (external memory control signals CS, RAS, and WE which are low-level, an external memory control signal CAS which is high-level). At this time, the level of the internal write signal included in the internal command signal of the command decoder 16 changes from the low-level to the high-level. According to the change in level of the internal write signal to the high-level, a pre-charge operation is performed in the semiconductor device 10. In other words, the row decoder 13 receives an activation/deactivation indicating deactivation and thereby becomes deactivated. Then, word lines of the memory cell array 11 enter a non-selected state. The bit lines of the memory cell array 11 are pre-charged to a predetermined voltage. Thus, the semiconductor device 10 enters the IDLE state. By the input of the PRE command, the column decoder 14, the sense amplifier 15, the Y-redundancy circuit 20A, and the data input/output circuit 19 receive an activation/deactivation control signal indicating deactivation, and thereby become deactivated.

Thus, the semiconductor device 10 tests memory cells belonging to the two regions. For this reason, the test circuit 22 is validated by one time supply of the MRS command. Then, the WRT command or the READ command is supplied multiple times together with a column address between a supply of the ACT command and a supply of the PRE command. Thereby, both the normal memory cell region 111 and the redundant memory cell region 112 can be accessed during an operation cycle indicated by one ACT command (while one word line is selected and maintained).

Figure 5:
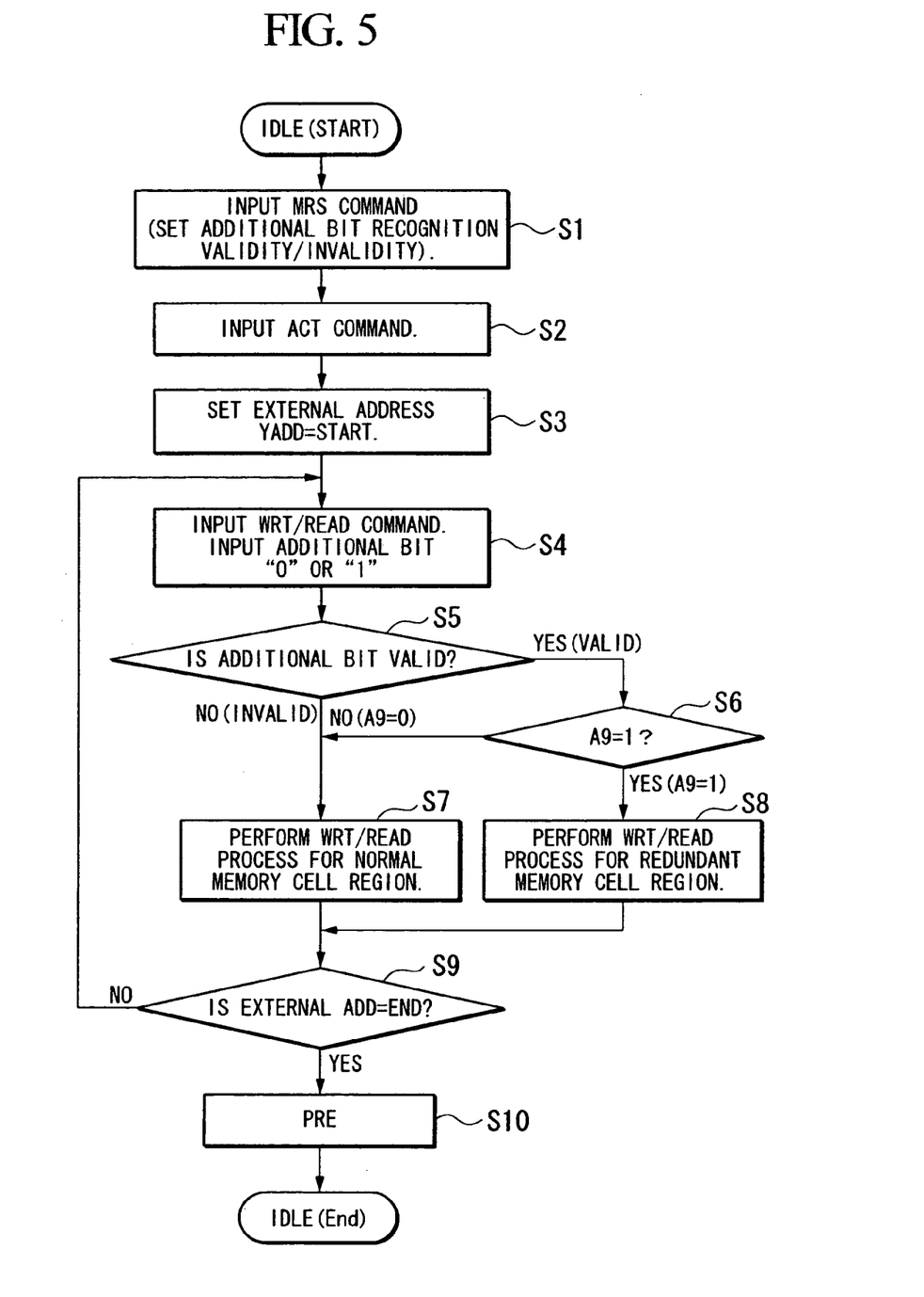
FIG. 5 is a flowchart illustrating a test performed by the semiconductor device 10.

Hereinafter, a test method for the semiconductor device 10 having the above configuration is explained with reference to FIG. 5. FIG. 5 is a flowchart illustrating a process flow indicative of a test method of the semiconductor device 10. Hereinafter, a process for the semiconductor device 10 to select one word line in the normal memory cell region 111 and the redundant memory cell region 112 of the memory cell array 11, and then to access memory cells connected to the selected word line is explained with FIG. 5.

The tester supplies an MRS command (first logic indicated by multiple terminals) and an address signal to the semiconductor device 10 in the IDLE state (step S1). When a logic of the address signal is a logic of a predetermined address, the Y-redundancy activation control test circuit (fifth control circuit) 174 changes the level of the test circuit validation signal TRYCNT from the low-level to the high-level so that a logic of the address terminal (first external terminal) A9 (logic indicated by the first external terminal, hereinafter, the logic is denoted assuming that an additional bit A9 such that A9=0 or A9=1) can be inputted to the test circuit 22.

On the other hand, when the logic of the address signal is not the logic of the predetermined address, the Y-redundancy activation control test circuit 174 maintains the low-level of the test circuit validation signal TRYCNT, and does not validate the test circuit 22.

Then, the tester supplies an ACT command and an address indicating the position of the word line (step S2). A word line is selected in the memory cell array 11 (the normal memory cell region 111 and the redundant memory cell region 112) of the semiconductor device 10. Additionally, multiple memory cells connected to the selected word line are connected to corresponding bit lines. After a predetermined period of time, the sense amplifier 15 operates so that data pieces stored in the respective memory cells selected are amplified.

Then, an initial address value (external START address) and an end address value (external END address), which are used for the semiconductor device 10 to perform column selection, are set to the internal resistor of the tester (step S3). For example, the external START address is the smallest address (Y000) of the normal memory cell region 111. The external END address is the largest address (Y511) in the normal memory cell region 111.

After step S3, the tester supplies, to the semiconductor device 10, the external START address set in step S3 as a column address together with a WRT command (or a READ command). Based on the WRT command (or the READ command), the Y-address decoder (first control circuit) and the redundancy Y-driver (second control circuit), which are column circuits included in the semiconductor device 10, are activated. The tester supplies a low-level signal (logic "0" of the additional bit A9) or a high-level signal (logic "1" of the additional bit A9) simultaneously with the supply of the column address (step S4).

When the inputted test circuit validation signal TRYCNT is high-level (the additional bit A9 is valid), the test circuit 22 outputs a test signal TREDY based on a logic of the address terminal A9 (step S5: YES). On the other hand, when the test circuit validation signal TRYCNT is low-level (the additional bit A9 is invalid), the test circuit 22 maintains the low-level of the test signal TREDY (step S5: NO).

When the additional bit A9 is valid and the internal address signal CIA<9> is high-level (the logic of the address terminal A9 is 1), the test circuit 22 changes the level of the test signal TREDY from the low-level to the high-level (step S6: YES). On the other hand, when the additional bit A9 is valid and the internal address signal CIA<9> is low-level (the logic of the address terminal A9 is 0), the test circuit 22 maintains the low-level of the test signal TREDY (step S6: NO).

If step S5 is YES or step S6 is NO (if the additional bit A9 is valid and the additional bit is 0, or if the additional bit A9 is invalid), the routine proceeds to step S7. If step S6 is YES (the additional bit A9 is valid, and the additional bit is 1), the routine proceeds to step S8.

If step S5 is YES or step S6 is NO (if the additional bit A9 is valid and the additional bit is 0, or if the additional bit A9 is invalid), since the test signal TREDY outputted from the test circuit 22 is low-level, the activated Y-address pre-decoder circuit 123 pre-decodes column addresses, and outputs the pre-decoded signals. The Y-address decoder 141 decodes the received pre-decoded signals, outputs a Y-switch signal YSW000, and selects a column at the column address specified by the tester.

When the currently supplied command is the WRT command, the tester writes data in the accessed memory cell via the data input/output circuit 19. When the READ command is supplied, the data stored in the accessed memory cell is read out via the data input/output circuit 19. Then, the tester determines whether or not the read data matches an expectation value (data previously written in the memory cell) (step S7).

If step S6 is YES (the additional bit A9 is valid and the additional bit is 1), since the test signal TREDY outputted from the test circuit 22 is high-level, the activated Y-redundancy circuit 20A compares, to the redundant ROM address, the column address supplied simultaneously with the WRT command or the READ command. If the column address matches the redundant ROM address, the Y-redundancy circuit 20A outputs a redundancy Hit signal. The redundancy Y-driver 142 receives the redundancy Hit signal, outputs a redundancy Y-switch signal RYSW corresponding to the redundant ROM address, and selects memory cells in the redundant memory cell region 112 in units of columns.

When the currently-supplied command is the WRT command, the tester writes data in the accessed memory cell via the data input/output circuit 19. When the READ command is supplied, the data stored in the accessed redundant memory cell is read out via the data input/output circuit 19. Then, the tester determines whether or not the read data matches an expectation value (data previously written in the redundant memory cell) (step S8).

Then, the tester determines whether or not a column address to be supplied to the semiconductor device 10 matches the external END address set to the internal resistor in step S3 (step S9). If the column address does not match the external end address, the tester increments the address to be supplied, and then performs the operations after step S4 (step S9: NO). If the column address matches the external END address, the tester terminates the supply of the WET command or the READ command since all the memory cells (normal and redundant memory cells), which are selected by one word line selected based on the ACT command, have been accessed (step S9: YES).

The tester supplies a PRE command to the semiconductor device 10, and causes the semiconductor device 10 to re-enter the IDLE state (step S10).

According to the semiconductor device 10, the third logic validates the test circuit (fourth control circuit) 22. In the first embodiment, the MRS code is supplied to the Y-redundancy activation control test circuit 174 so that the test circuit 22 is validated.

Then, when a READ command or a WRT command is supplied to the semiconductor device 10, the command control circuit (third control circuit) 23 activates the Y-address pre-decoder circuit and the Y-address decoder (first control circuit) 141 which access the normal memory cell region 111, and the Y-redundancy circuit 20A and the redundancy Y-driver (second control circuit) 142 which access the redundant memory cell region 112.

Then, when a READ command or a WRT command is supplied to the semiconductor device 10 to perform column selection control, the level of a voltage to be supplied to the address terminal (first external terminal) A9 validated by the command control circuit 23 is changed.

Thereby, the test circuit 22 switches between column selection in the normal memory cell region 111 performed by the Y-address decoder 141 and column selection in the redundant memory cell region 112 performed by the redundancy Y-driver 142.

Accordingly, an access to the normal memory cell region 111 and an access to the redundant memory cell region 112 can be switched by only changing the logic of the address terminal A9 in an operation indicated by one ACT command. Therefore, it is unnecessary to supply, at each time of switching the regions, the ACT command, the PRE command that orders deactivation of the semiconductor device of the related art, the MRS command that orders switching to the redundant region, as required for the semiconductor device of the related art. Accordingly, memory cells included in the normal and redundant regions can be accessed alternately. Alternatively, after all memory cells included in one region are accessed, all memory cells included in the other region can be accessed. Therefore, a memory cell testing time can be reduced, thereby reducing the testing cost.

The present invention is applicable to a test of two regions (a normal region and a redundant region) which are used as various functions. The present invention is not limited to the connection relationship of each block, a circuit format, a circuit that generates other control signals, which are shown in the drawings.

For example, it has been explained in the first embodiment that the address signal CIA<9> is inputted to the test circuit 22. However, an external terminal (first external terminal) other than the address terminal A9 may be directly or indirectly connected to the test circuit 22 so that a second logic is inputted thereto. Then, when a READ command or a WRT command is received from an external unit, the command control circuit (third control circuit) 23 controls the validated test circuit (fourth control circuit) 22. In this case, a test signal TREDY is generated based on a L/H level of the external terminal (first external terminal) other than the address terminal A9.

Alternatively, the test circuit 22, which has been validated by the Y-redundancy activation control test circuit (fifth control circuit) 174, may not be controlled by the command control circuit 23. In this case, a test signal TREDY that is L/H level is generated based on the L/H level of the first external terminal. In any cases, the test circuit 22 generates the test signal TREDY based on a logic indicated by the first external terminal, and thereby switches the first control circuit and the second control circuit.

The semiconductor device and the method of testing the same of the present invention are applicable to various semiconductor devices. The first embodiment has been explained with an example of memories. However, the present invention is not limited thereto, and is applicable to other semiconductor devices, such as a CPU (Central Processing Unit), an MCU (Micro Control Unit), a DSP (Digital Signal Processor), an ASIC (Application Specific Integrated Circuit), and an ASSP (Application Specific Standard Product). Further, these semiconductor devices may include normal memory cells and redundant memory cells.

A product of the semiconductor device, to which the present invention is applied, includes an SOC (System On Chip), an MCP (Multi-Chip Package), a POP (Package On Package), and the like. The present invention is applicable to a semiconductor device including such a product and a package.

As long as an FET (Field Effect Transistor) is used, the present invention is applicable to various FETs, such as an MIS (Metal-Insulator Semiconductor) and a TFT (Thin Film Transistor), which is other than an MOS (Metal Oxide Semiconductor). Further, the semiconductor device may include a bipolar transistor.

Moreover, an NMOS transistor and a PMOS transistor are examples of the first type transistor and the second type transistor, respectively.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

What is claimed is:

1. A semiconductor device comprising:
   a first memory region;
   a second memory region, the first and second memory regions being mutually exclusive at the same time;
   a first control circuit that performs a first access to the first memory region;
   a second control circuit that performs a second access to the second memory region;
   a third control circuit that controls activation and deactivation of the first and second control circuits based on a first logic received from a plurality of first external terminals;
   a fourth control circuit that switches between the first and second accesses based on at least a second logic received from a second external terminal; and
   a fifth control circuit that controls validation and invalidation of the fourth control circuit.

2. The semiconductor device according to claim 1, further comprising:
   the fifth control circuit that controls the validation based on a third logic indicated by a test mode command, the test mode command ordering the semiconductor device to enter a test operation mode.

3. The semiconductor device according to claim 2, wherein the fifth control circuit generates a first signal that validates an operation of the fourth control circuit based on the third logic, and
   the fourth circuit switches between the first and second accesses based on the second logic and the first signal.

4. The semiconductor device according to claim 2, wherein the test mode command is a mode register command supplied from the plurality of first external terminals.

5. The semiconductor device according to claim 2, wherein the second external terminal is different from the plurality of first external terminals.

6. The semiconductor device according to claim 2, wherein the test mode command is supplied from at least a third external terminal that is different from the plurality of first external terminals.

7. The semiconductor device according to claim 3, wherein the third control circuit activates the second logic.

8. The semiconductor device according to claim 1, wherein
the first and second memory regions comprise a plurality of memory cells defined by a plurality of rows and a plurality of columns,
the first control circuit comprises a first circuit that selects a first column of the plurality of columns, and the first column being included in the first memory region, and
the second control circuit comprises a second circuit that selects a second column of the plurality of columns if a defective memory cell of the plurality of memory cells is connected to the first column, the second column being included in the second memory region.

9. The semiconductor device according to claim 8, further comprising:
a third circuit that selects one of the plurality of rows, and
wherein the third control circuit controls the third circuit to activate the first and second control circuits and controls the third circuit to select the one of the plurality of rows when an active command is supplied to the plurality of first external terminals, the active command ordering selection of one of the plurality of rows.

10. The semiconductor device according to claim 9, wherein
any one of a write command and a read command is supplied to the plurality of first external terminals after the active command is supplied, the write command ordering writing of data in the first memory region, and the read command ordering reading of data from the first memory region, and
the fourth control circuit allows, based on the write command or the read command, any one of the first and second circuits to operate.

11. The semiconductor device according to claim 9, wherein data is read from or written in one of the plurality of memory cells which is accessed based on the one of the plurality of rows and any one of the first and second columns.

12. A method of testing a semiconductor device, comprising:
supplying a first logic to a mode register one time;
supplying a first command to a command control circuit one time, the first command ordering activation of a word line;
supplying a second command and address information to the command control circuit multiple times, the second command ordering selection of a bit line based on the address information;
supplying a second logic to a test circuit simultaneously with the second command, the second logic ordering selection of any one of the bit line and a redundant bit line correlated to the bit line; and
performing data access corresponding to the bit line and the redundant bit line based on the first and second logics without supplying a third command that orders deactivation of the word line.

13. The method according to claim 12, wherein the second logic is changed based on each of the plurality of second commands.

14. The method according to claim 13, wherein
the first and second commands are supplied from a plurality of first external terminals, and
the second logic is supplied from a second external terminal that is different from the plurality of first external terminals.

15. The method according to claim 14, wherein the first logic is supplied to the mode register by supplying a mode resister command.

16. The method according to claim 15, wherein the mode resister command is supplied from the plurality of first external terminals.

17. The method according to claim 14, wherein the first logic is supplied from at least a third external terminal that is different from the plurality of first external terminals.

* * * * *